United States Patent
Shuey

(10) Patent No.: US 6,241,536 B1
(45) Date of Patent: *Jun. 5, 2001

(54) HIGH DENSITY CONNECTOR SYSTEM

(75) Inventor: Joseph B. Shuey, Camp Hill, PA (US)

(73) Assignee: Berg Technology, Inc., Remo, NV (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/376,850

(22) Filed: Aug. 18, 1999

Related U.S. Application Data

(62) Division of application No. 08/948,751, filed on Oct. 10, 1997, now Pat. No. 5,975,921.

(51) Int. Cl.⁷ ................................................ H01R 12/00
(52) U.S. Cl. ............................................. 439/83; 228/254
(58) Field of Search ..................... 439/83, 81; 228/254, 228/164, 173.1, 173.3, 179.1, 180.1, 180.21

(56) References Cited

U.S. PATENT DOCUMENTS

| | | | |
|---|---|---|---|
| Re. 32,691 | 6/1988 | Dola et al. | 439/608 |
| 4,396,140 | 8/1983 | Jaffe et al. | 228/122.1 |
| 4,678,250 | * 7/1987 | Romine et al. | 439/83 |
| 4,722,470 | * 2/1988 | Johary | 228/180.2 |
| 4,846,727 | 7/1989 | Glover et al. | 439/608 |
| 4,975,084 | 12/1990 | Fedder et al. | 439/608 |
| 5,046,960 | 9/1991 | Fedder | 439/108 |
| 5,046,966 | 9/1991 | Snyder et al. | 439/579 |
| 5,066,236 | 11/1991 | Broeksteeg | 439/79 |
| 5,104,341 | 4/1992 | Gilissen et al. | 439/608 |
| 5,162,001 | 11/1992 | Harwath et al. | 439/608 |
| 5,178,549 | 1/1993 | Neumann et al. | 439/74 |
| 5,213,521 | 5/1993 | Arisaka | 439/608 |
| 5,261,829 | 11/1993 | Fusselman et al. | 439/108 |
| 5,286,212 | 2/1994 | Broeksteeg | 439/108 |
| 5,331,514 | 7/1994 | Kuroda | 361/760 |
| 5,342,211 | 8/1994 | Broeksteeg | 439/108 |
| 5,358,417 | * 10/1994 | Schmedding | 439/178 |
| 5,403,206 | 4/1995 | McNamara et al. | 434/608 |
| 5,484,310 | 1/1996 | McNamara et al. | 439/608 |

(List continued on next page.)

FOREIGN PATENT DOCUMENTS

| | | | |
|---|---|---|---|
| 0 591 772 A1 | 4/1994 | (EP) . | |
| 843 383 | * 5/1998 | (EP) | H01R/9/09 |

OTHER PUBLICATIONS

Fumitsu, Ltd., "Introducing the Dimple Plate Solder Board Transcription Method." Aug. 1997 (with translation).

*Primary Examiner*—Tulsidas Patel
(74) *Attorney, Agent, or Firm*—Brian J. Hamilla; M. Richard Page; Steven M. Reiss

(57) ABSTRACT

An electrical connector illustrated as a plug and receptacle is disclosed. In one embodiment, the connector includes a base member having a plurality of bores. A first plurality of contact elements is positioned in certain of the bores. The tail portion of each contact element extends a distance beyond the base member. A second plurality of contact elements is positioned in others of the bores. Insertion of the tail portion of the second plurality of contact elements into a circuit board is sufficient to hold the tail portions of the first plurality of contact elements against the circuit board. It is preferred for the tail portions of the second plurality of contacts to be capable of axial movement when a compression force is applied. In another embodiment, the connector includes a frame and a layer of contact elements, wherein each of the contact elements includes a forward end and a tail portion. The ends of the tail portions are positioned proximate the bottom surface of the frame. A plurality of shaped fusible elements, for example, solder balls, are located proximate the ends of the tail portions. In such an embodiment, the solder balls preferably have a deformed spherical shape, wherein the aspect ratio is greater than one.

22 Claims, 3 Drawing Sheets

U.S. PATENT DOCUMENTS

| | | | |
|---|---|---|---|
| 5,496,183 | 3/1996 | Soes et al. | 439/79 |
| 5,516,032 | 5/1996 | Sakemi et al. | 228/246 |
| 5,538,433 | 7/1996 | Arisaka | 439/70 |
| 5,562,462 | 10/1996 | Matsuba et al. | 439/70 |
| 5,585,162 | 12/1996 | Schueller | 428/131 |
| 5,605,476 | 2/1997 | McNamara et al. | 439/608 |
| 5,607,326 | 3/1997 | McNamara et al. | 439/608 |
| 5,735,697 * | 4/1998 | Muzslay | 439/83 |
| 5,918,796 * | 7/1999 | Matsuda et al. | 228/254 |

* cited by examiner

HIGH DENSITY CONNECTOR SYSTEM

CROSS REFERENCE TO RELATED APPLICATIONS

This application is a divisional of U.S. patent application Ser. No. 08/948,751, filed on Oct. 10, 1997 and issued as U.S. Pat. No. 5,975,921 on Nov. 2, 1999, herein incorporated by reference.

FIELD OF THE INVENTION

The present invention relates to electrical connectors, and more particularly, to high density connectors intended for the interconnection of daughter boards and back panels.

BACKGROUND OF THE INVENTION

Continued advances in the design of electronic devices for data processing and communications systems have placed rigorous demands on the design of electrical connectors. Specifically, electrical connectors having higher densities and pin counts are needed for design advances which increase integration of solid state devices and which increase the speed of data processing and communication. Designing connectors to have higher densities and higher pin counts requires careful consideration of the problems which result from decreasing the distance between contacts. This is particularly true in applications involving daughter board/back panel interconnections where the connector functions to establish an electrical connection and functions to mechanically hold the daughter board in position.

Density and pin count are often viewed interchangeably, but there are important differences. Density refers to the number of contacts provided per unit length. In contrast, the number of contact elements that can reasonably withstand the mating and unmating forces is referred to as the pin count. As more functions become integrated on semiconductor chips or on flexible circuit substrates and more chips are provided on printed circuit boards (PCBs), each PCB or flexible circuit must provide more inputs and outputs (I/Os). The demand for more I/Os directly translates to a demand for greater density without sacrificing electrical or mechanical performance, particularly when such devices and integration techniques are utilized in devices having back panels.

The importance of electrical performance of high density connectors was recognized in U.S. Pat. No. 4,824,383—Lemke, incorporated herein by reference. This patent proposed designs for plug and receptacle connectors for multiple conductor cables or multiple trace substrates. In such designs electrical performance was assured by electrically isolating individual contact elements or groups of contact elements through the use of conductive walls to prevent or minimize crosstalk and signal degradation. Although, the connectors disclosed in U.S. Pat. No. 4,824,383 increased contact element density, industry driven density demands continued to grow. U.S. Pat. Nos. 5,057,028—Lemke et al. and 5,169,324—Lenke et al. (now U.S. Pat. No. Re. 35.508), all incorporated herein by reference, disclose two row plug and receptacle connectors for attachment to printed circuit boards (PCBs), which connectors again exhibited good electrical performance through the use of conductive walls to provide isolation.

Electrical performance for high density connectors was also the focus of U.S. Pat. Nos. 4,846,727, 5,046,960, 5,066,236, 5,104,341, 5,496,183, 5,342,211 and 5,286,212. These patents disclose various forms of stripline structures incorporated into a plug and receptacle system. In a high density stripline structure, columns of contact elements arranged in a side-by-side array with conductive plates disposed between each column. The connectors are designed so that the plug and receptacle ground plates contact one another, thereby providing isolation between columns. A further aspect of this system is the modular design of the receptacle. Each column of receptacle contact elements is formed by molding the contact elements into a frame of dielectric material. One of the problems with these types of connectors is that the use of conductive walls for electrical isolation requires space. In certain applications the space or volume necessary for such isolation is impractical.

In those applications where space is critical, proposals for achieving desired electrical performance have included the use of high density connectors in which one pin, selected for signal transmission, is positioned between pins connected to ground. Such patterns are known as interstitial arrangements. Such contact element patterns are suggested in U.S. Pat. Nos. 5,174,770, 5,197,893 and 5,525,067. It will be appreciated that while such isolation schemes can be implemented in more compact connectors, such schemes require greater numbers of pins than were available in the previously described connectors using conductive walls.

In back panel applications, increasing the number of pins has a direct impact on mechanical integrity. As the number of pins increases, the number of bores or through holes in the back panel and daughter board increases. As the number of bores in a printed circuit board increases while at the same time decreasing the distance between each bore, as will be the case in high density applications, the mechanical integrity of the board decreases. As mechanical integrity decreases the ability for the back panel to mechanically hold the daughter board in position decreases.

It will be appreciated that in back panel applications, the daughterboard is held in position, i.e., vertical and horizontal orientation, sometimes exclusively, by the connector used to electrically interconnect the two. Daughterboard size, the number of daughterboards and the components mounted to the daughterboards combine to produce the stresses and moments acting on the back panel after assembly. If the amount of back panel material is reduced in particular locations due to larger numbers of closely spaced through bores, back panel failure can occur, i.e., the back panel could deform or even break.

One might conclude that the solution to back panel mechanical failure would be to use surface mount techniques to establish electrical connection to the back panel. Since surface mount techniques do not require the use of through holes, such techniques would afford the ability to connect high density connectors to the back panel without impacting mechanical integrity. Unfortunately, such solutions would be unsuccessful.

Surface mount techniques typically involve temporarily fixing a component to a printed circuit board using a paste. After pasting, the board and temporarily fixed components are heated in order to reflow solder material previously coated onto the leads of the surface mount components. In back panel applications, numerous connectors are attached to the back panel board, which is typically a relatively large circuit board. In order to assure adequate reflow, thereby establishing good electrical connection, for numerous components spread over a relatively large board, the back panel board would have to be subjected to significant heat. Unfortunately, heat which is too high or too long in duration can actually interfere with establishing good surface mount terminations. Consequently, surface mount techniques do not form the answer to the need for higher density connectors for back panel applications.

Consequently, a need still exists for a connector system which maximizes the number of contact elements available for ground/signal assignment and which does not jeopardize either the electrical or mechanical integrity of back panel applications.

One other consideration which must be taken into account when designing high density connectors, particularly for back panel applications is the design of the structure for attaching the receptacle portion of the connector. One important factor in receptacle attachment is alignment. When a single receptacle contact element is misaligned, insertion force increases a negligible amount. However, when misalignment occurs in a high density contact receptacle, insertion force could increase to unacceptable levels. In other words, if misalignment occurs during the mounting of a receptacle to a circuit board, it may become impractical for the board to be mounted to a plug or vice versa.

Consequently, a need still exists for a high density connector system which provides sufficient alignment after mounting such that insertion force remains within acceptable limits.

SUMMARY OF THE INVENTION

The above described problems are resolved and other advantages are achieved in novel high density electrical connectors. In one embodiment, the connector includes a base member having a plurality of bores. A first plurality of contact elements is positioned in certain of the bores. A second plurality of contact elements is positioned in others of the bores. The tail portion of each contact element extends a distance beyond the base member. The insertion of the tail portion of the second plurality of contact elements into circuit board through bores is sufficient to hold the tail portions of the first plurality of contact elements against the circuit board.

It is preferred for the tail portions of the first plurality of contacts to be capable of axial movement when a compression force is applied. In this later embodiment, it is especially preferred for the tail portions of the second plurality of contacts to include a serpentine structure.

In another embodiment, the connector includes a frame and a layer of contact elements, attached to the frame. Each of the contact elements includes a receiving portion and a tail portion. The ends of the tail portions are positioned proximate the bottom surface of the frame. A plurality of fusible elements, for example, solder balls, are located proximate the ends of the tail portions. In such an embodiment, the solder balls extend within a desired distance from the base. This result is achieved by using solder balls having a deformed spherical shape. It is especially preferred for the deformed spherical shape to have a flattened bottom surface.

In a still further embodiment, projections are attached to the bottom of the frame for keying and spacing said frame in relation to a printed circuit board. In this embodiment, it is again preferred for the solder balls to have a deformed spherical shape, wherein the deformed spherical shape is flattened, i.e., the aspect ratio of the solder ball includes greater length than height.

BRIEF DESCRIPTION OF THE DRAWINGS

The present invention will be better understood and its numerous objects and advantages will become apparent by reference to the following detailed description of the invention when taken in conjunction with the following drawings, in which.

DETAILED DESCRIPTION OF THE INVENTION

Figure 1:
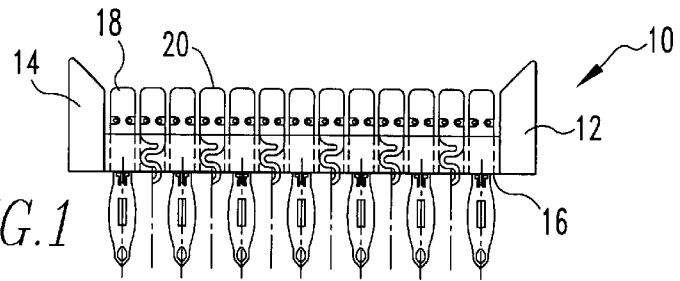
FIG. 1 is a partial sectional view of a header constructed in accordance with the resent invention.
Figure 2:
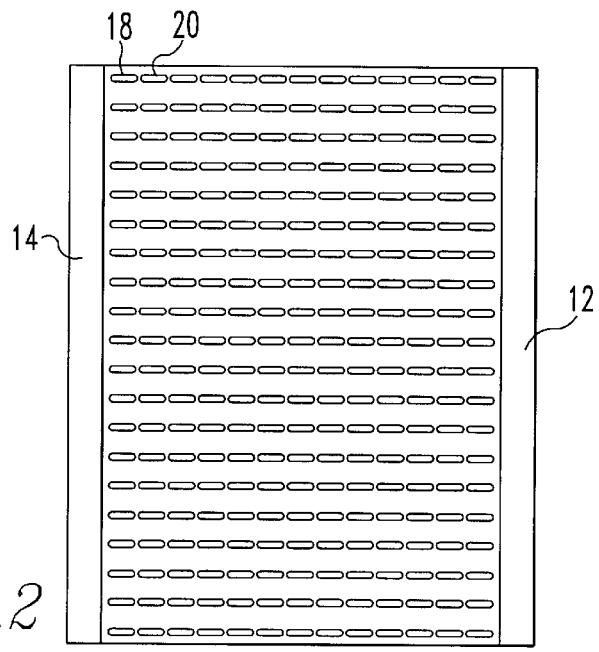
FIG. 2 is a top view of the complete header depicted in FIG. 1.

As was discussed above, one need which still exists in the industry is a connector having greater density. To this end, a new connector 10 has been developed and is generally depicted in FIG. 1. Although depicted as a plug, it will be appreciated that the invention is applicable to either a plug or receptacle. Connector 10 is seen to include side walls 12 and 14 and base wall 16. A number of blades 18 and 20 are disposed in bottom wall 16. It is noted that blades 18 include a deformable tail portion, preferably in the form of a press fit section which extends a distance below the bottom surface of bottom wall 16. By contrast, blades 20 include a much shorter, compressible tail portion which extends only a short distance from the bottom surface of bottom wall 16. It is noted that the serpentine or S shape of the tail portion of blade 20 permits the tail portion to be compressed upon the exertion of force on the tail. FIG. 2 is a top view of plug 10.

Figure 3:
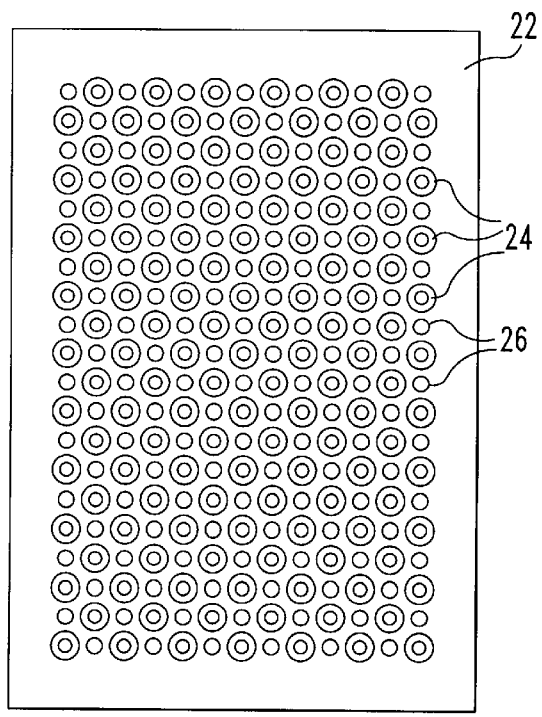
FIG. 3 is a top view of the printed circuit board on which the header of FIG. 1 is be mounted.

Connectors constructed in accordance with the invention have the advantage of requiring only half the pins having through holes while the other half utilizes contact pads for establishing electrical connection. In back panel applications, such a construction preserves the mechanical integrity of the back panel while providing a significantly higher pin density. FIG. 3 depicts the portion of printed circuit board 22 onto which plug 10 is to be mounted. Circuit board 22 includes a pattern of bores 24 and contact pads 26. It is noted that the diameter of the contact pad is smaller than the diameter of the bore and that the bores and contact pads are arranged in an alternating pattern.

When plug 10 is mounted to circuit board 22, the tail portions of blades 18 are inserted into bores 24. The force of insertion causes the compressible end portions of blade 20 to establish electrical contact with pads 26. It is preferred for the tail portions of blades 18 to be either deformable or of a shape to cause a friction force between the tail portion and circuit board 22 sufficient to hold plug 10 in place and maintain electrical contact between the tail portions of blades 20 and contact pads 26.

Figure 4:
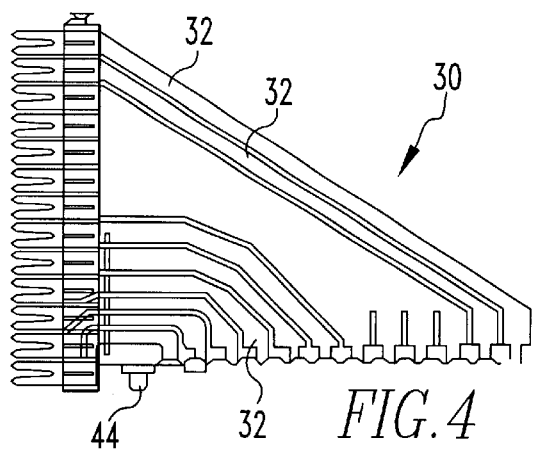
FIG. 4 is a diagrammatic side view of a receptacle constructed in accordance with the present invention.

Referring now to FIG. 4, connector 30, constructed in accordance with the present invention will be described.

Figure 5:
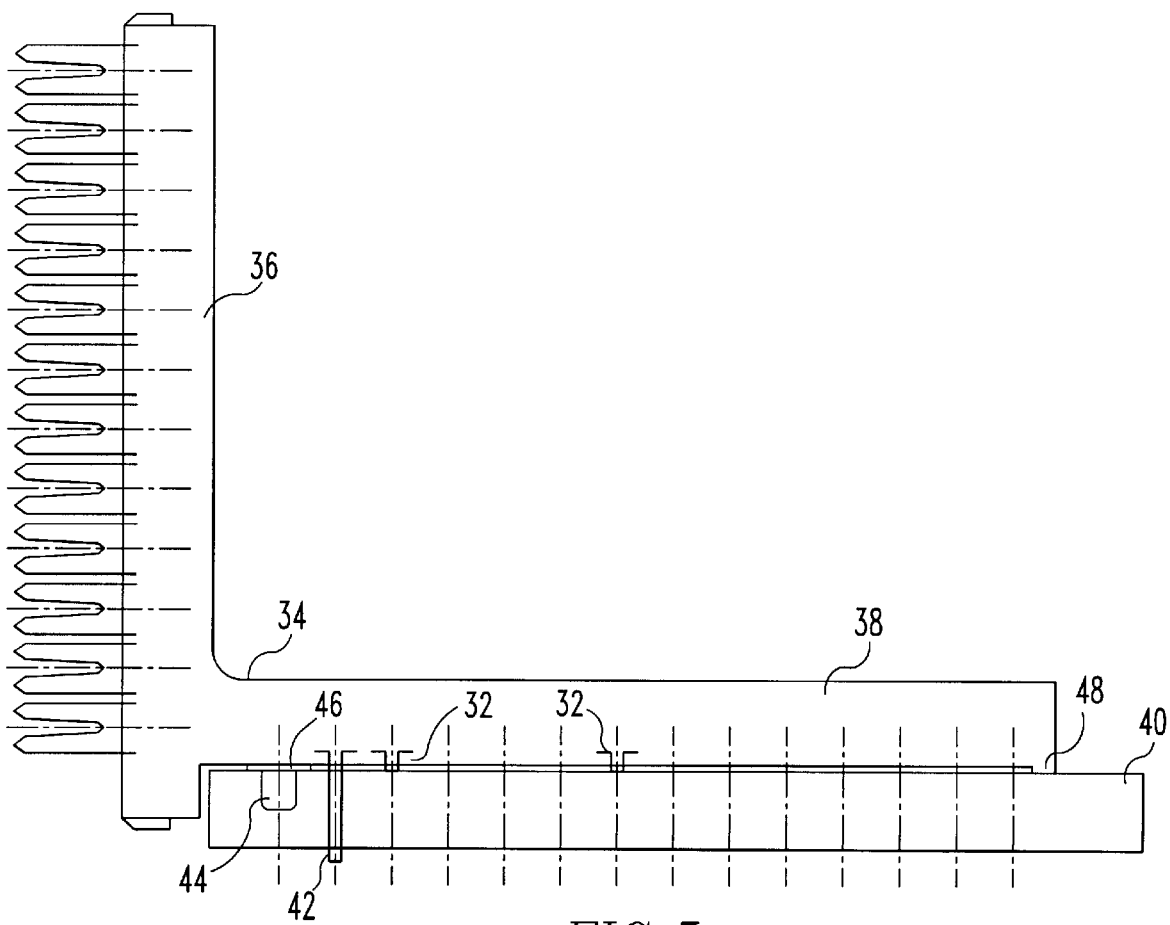
FIG. 5 is an enlarged diagrammatic view of the receptacle depicted in FIG. 4.

Although depicted as a receptacle, it will be appreciated that the invention is applicable to either a plug or receptacle. Connector 30 is shown diagrammatically to include a number of contact elements 32. It is noted that the contact elements are oriented in generally the same plane and are preferably provided as layer modules. Assembly of receptacle 30, thereby requires the stacking of a number of layers of contact elements in a side by side relationship. As shown in FIG. 5, each layer of contact elements includes a positioning frame 34 formed from upstanding portion 36 and base portion 38. It may be desirable during manufacture, to integrally mold portions 36 and 38 to a series of contact elements 32, thereby forming a contact element module.

One traditional method of mounting receptacle 30 to printed circuit board 40 would have been through the use of extended tails 42 which pass through appropriately sized bores in circuit board 40 for attachment by soldering or the like. However, as was pointed out in relation to the plug being mounted to circuit board 22 in FIG. 3, bore size can have a limiting effect on contact element density. To this end, the receptacle of the present invention includes a novel structure for establishing electrical contact between module 30 and circuit board 40.

The present invention utilizes fusible elements, for example, solder balls for mounting module 30 to board 40. Because module 30 is a high density module, the use of solder balls will be sufficient to establish both electrical contact as well as providing sufficient mechanical force for maintaining the attachment of module 30. To this end, a pattern of contact pads (not shown) are disposed on the surface of circuit board 40.

A keying peg 44 is provided on base portion 38 for aligning the tail ends of contact elements 32 above individual contact pads. Shoulder 46 and leg 48 serve to space the bottom of base portion 38 from the top of circuit board 40. It may be desirable to precisely fix this distance. As will be explained in greater detail in relation to FIGS. 6–8, contact elements 32 are electrically connected to contact pads (not shown) on the surface of circuit board 40 through the use of solder balls.

Figure 6:
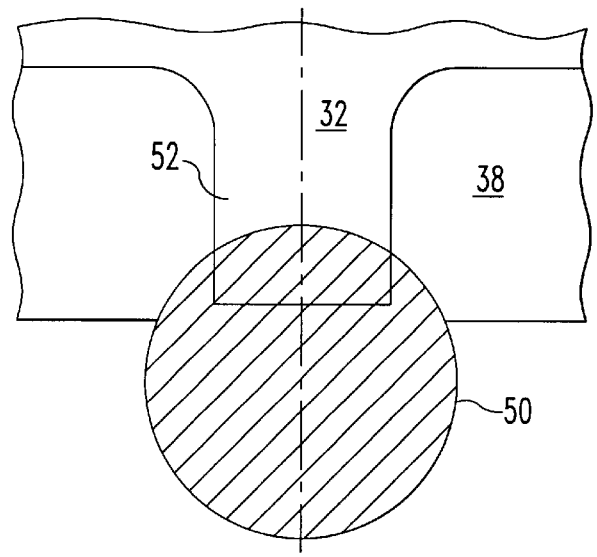
FIG. 6 is a still further enlarged view of an end of one of the contact elements having a solder ball mounted thereto.

Referring now to FIG. 6, the end of one of the contact elements 32 is disclosed. A fusible element, for example, solder ball 50 is shown attached to end 52. Attachment of solder ball 50 can be by any suitable means, for example by reflowing techniques. It is noted that the bottom surface of base 38 extends a short distance beyond the end surface of end 52. In other words, the end surface of end 52 is recessed within base portion 38. After attachment of solder ball 50 to end 52 the solder ball extends beyond the bottom surface of base portion 38.

Although the use of solder balls permits high density connection without through bores, one problem still remains. Because the solder balls extend beyond the bottom surface of base portion 38, connector 30 may be suspended a short distance above the circuit board when the connector is assembled onto a circuit board. In such a situation, when solder balls 50 are reflowed in order to establish electrical connection with the contact pads (not shown), movement, i.e., re-alignment, of module 30 will occur. Such re-alignment can cause insertion force to rise to unacceptable levels. This problem has been largely overcome by the present invention.

In the present invention, the fusible elements are deformed to yield an aspect ratio in which length (the dimension parallel to the circuit board to which the connector is to be mounted) is greater than the height (the dimension parallel to a line from the point of attachment to the circuit board to the frame). In such a case, the aspect ratio of the fusible element is greater than one. In other words, the fusible element or solder ball is wider than it is high.

Consider briefly, techniques for positioning deformed fusible elements, such as solder balls, on the ends of contact elements 32. Two general techniques are envisioned. In the first technique, the fusible elements, such as solder balls, are forcibly pressed onto the ends of elements 32 and thereafter deformed. The deformation process can include either fixing the frame and pressing or striking a platen-like device (not shown) against the bottom surface of each solder ball or by pressing each solder ball against an anvil-like device. In either case, the solder ball is preferably deformed to have a flattened shape.

In the second technique for attaching fusible elements, such as solder balls, onto the ends of contact elements 32, the fusible elements are placed near the ends or terminal stubs of the contact elements and subjected to heat in order to cause reflow to occur. Reflow will cause the fusible elements to become attached to the terminal stubs. Thereafter, the fusible elements are deformed. Again, the deformation process can include either fixing the frame and pressing or striking a platen-like device against the bottom surface of each fusible element or by pressing each solder ball against an anvil-like device. In either case, the fusible elements are again preferably deformed to have a flattened shape.

Consider the case where solder balls are used as the fusible element. After manufacturing it is probable that the ends of the solder balls may extend beyond the spacing distance established by shoulder 46 and leg 48. In other words when the connector is placed onto the circuit board it may initially be supported by certain of the solder balls rather than shoulder 46 and leg 48. When the solder melts, as during during reflow, the connector will physically move towards the circuit board, thereby realigning the connector. When flattened or deformed (aspect ratio greater than 1) solder balls are used, the connector moves a shorter distance. Accordingly, the opportunity for misalignment is significantly less, because, prior to reflow, the connector is in a position closer to the desired position in three dimensions (x, y and z). Having the connector positioned as close to the ultimate z position as possible, prior to reflow, is most critical.

Figure 7:
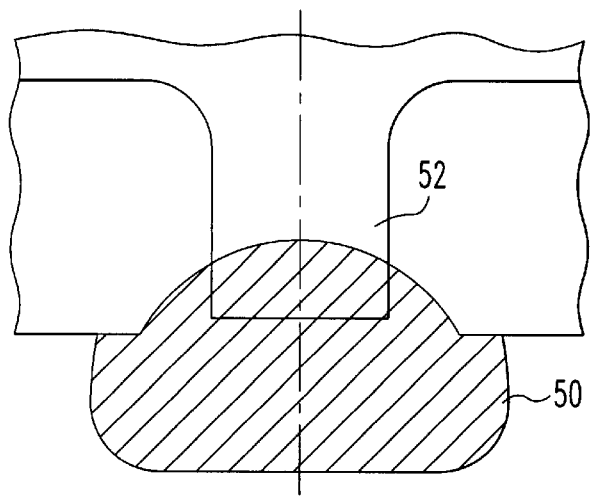
FIG. 7 is a view of the contact element depicted in FIG. 6 after the solder ball has been deformed in a manner in accordance with the invention.
Figure 8:
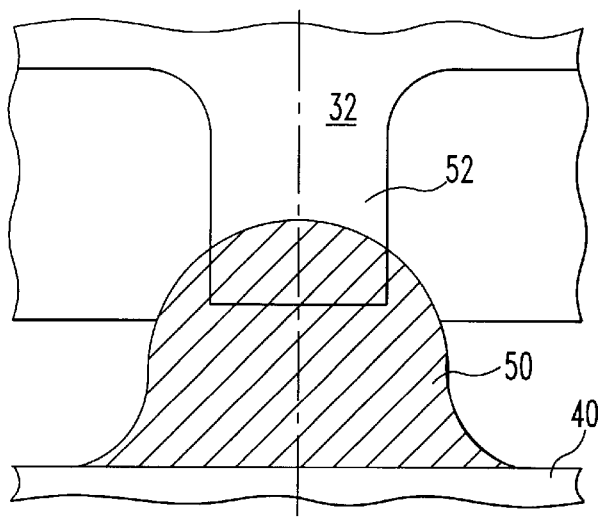
FIG. 8 is a view of the contact element depicted in FIG. 7 and a printed circuit board after the solder ball has reflowed establishing an electrical connection between the contact element and the printed circuit board.

In particular, referring to FIG. 7, it will be seen that solder ball 50 has been deformed, preferably by exerting a compression force on the solder ball. The exertion of such a compression force deforms the solder ball out of a spherical shape to preferably having a flattened bottom shape, i.e., an aspect ratio greater than one. When solder ball 50 is reflowed, it returns to a spherical shape eliminating the collapsed or deformed shape and changing the elevation of the connector. An example of such a reflowed solder ball is shown in FIG. 8. As can be seen from FIG. 8, solder ball 50, after reflow, has extended a distance such that electrical contact is now made between circuit board 40 and end 52 of contact element 32.

It has been discovered that when solder balls are reflowed, the mechanical forces generated during such operations cause re-alignment of the connector. Such re-alignment can cause insertion forces between mating connectors to rise to unacceptable levels. However, by first shaping the solder balls, as shown in FIG. 7, the degree of re-alignment which occurs is significantly reduced. Insertion forces following reflow of deformed solder balls do not rise to unacceptable levels.

Thus it will be seen that by utilizing deformed solder balls for establishing electrical contact with circuit board 40, electrical connection can be established in a much smaller surface area than heretofore realizable, thereby significantly increasing the potential for contact element density.

While the invention has been described and illustrated with reference to specific embodiments, those skilled in the art will recognize that modification and variations may be made without departing from the principles of the invention as described hereinabove and set forth in the following claims.

What is claimed is:

1. An electrical connector adapted to mount on a substrate, comprising:
    a body;
    a plurality of contact elements attached to said body, each having a mounting portion; and
    a plurality of formed bodies, each having a first shape before being secured to said mounting portion of a respective one of said contact elements and having a second shape, now including a deformed region that did not exist in said first shade, after being secured to said mounting portion of said contact element, said second shape being different than said first shape;
    wherein said deformed regions provide a generally planar surface for subsequent placement onto the substrate.

2. The electrical connector as recited in claim 1, wherein said formed bodies comprise masses of solder.

3. The electrical connector as recited in claim 2, wherein said masses of solder are solder balls.

4. The electrical connector as recited in claim 3, wherein said deformed regions comprise flattened bottoms on said solder balls.

5. The electrical connector as recited in claim 1, wherein said body has a mounting face positionable adjacent the substrate, said formed bodies extending past said mounting face.

6. The electrical connector as recited in claim 5, wherein said contact elements are recessed within said mounting face.

7. The electrical connector as recited in claim 1, wherein said formed bodies surround a distal end of said contact elements.

8. An electrical connector adapted for mounting to a circuit substrate, wherein prior to mounting on the circuit substrate, the connector comprises:
    a body having a mounting portion for facing the substrate;
    a plurality of contact elements attached to said body; and
    a plurality of formed bodies having a first shape before being secured to said contacts and a second shape, different than said first shape, after being secured to said contacts which now includes a generally planar area facing away from said mounting portion that did not exist in said first shape so that said bodies, except for said generally planar area, are generally curvilinear.

9. The electrical connector as recited in claim 8, wherein said formed bodies are masses of solder.

10. The electrical connector as recited in claim 9, wherein said masses of solder are solder balls.

11. An electrical connector adapted for mounting to a circuit substrate, wherein prior to mounting on the circuit substrate, the connector comprises:
    a body having a mounting portion for facing the substrate;
    a plurality of contact elements attached to said body and recessed within said mounting portion; and
    a plurality of formed bodies having a first shape before being secured to said contacts and a second shape, different than said first shape, after being secured to said contacts so that said bodies, except for a generally planar area facing away from said mounting portion for engaging the circuit substrate, are generally curvilinear.

12. The electrical connector as recited in claim 11, wherein said formed bodies surround a distal end of said contact elements.

13. A method of making an electrical connector mountable on a substrate, comprising the steps of:
    providing a body with a plurality of contact elements secured thereto, each contact element having a mounting portion;
    attaching a formed body having a first shape to each of said mounting portions; and
    deforming said formed bodies to create a second shape, different than said first shape, and including a deformed region that did not exist in said first shape and which provides a generally planar surface adapted for subsequent placement onto the substrate.

14. The method of making an electrical connector as recited in claim 13, wherein the deforming step occurs subsequent to the attaching step.

15. The method of making an electrical connector as recited in claim 13, wherein the attaching step comprises reflowing said formed body.

16. The method of making an electrical connector as recited in claim 15, wherein said formed body is a mass of solder.

17. The method of making an electrical connector as recited in claim 16, wherein said mass of solder is a solder ball.

18. The method of making an electrical connector as recited in claim 12, wherein the attaching step comprises pressing said formed bodies and said contacts against each other.

19. The method of making an electrical connector as recited in claim 13, wherein the deforming step comprises pressing said formed bodies and a surface against each other.

20. The method of making an electrical connector as recited in claim 13, further comprising the steps of:
    providing a circuit substrate; and
    attaching the electrical connector to said circuit substrate subsequent to the deforming step.

21. An electrical connector mountable to a substrate, comprising:
    an insulative housing having an opening therein;
    a contact in said opening; and
    a formed body secured to said contact and including:
        a first portion within said opening;
        a second portion outside of said opening; and
        a deformed region on said second portion;
    wherein said deformed region provides a generally planar surface for subsequent placement of the connector to the substrate.

22. The electrical connector as recited in claim 21, wherein said formed body secures to a tail end of said contact, said tail end residing within said opening.

* * * * *